United States Patent [19]
Suzuki et al.

[11] Patent Number: 6,084,486
[45] Date of Patent: Jul. 4, 2000

[54] CONTROLLABLE FILTER AND HIGH FREQUENCY APPARATUS USING THE SAME

[75] Inventors: Masanori Suzuki, Aichi; Hideya Kitamura; Hirokazu Kitamura, both of Gifu, all of Japan

[73] Assignee: Matsushita Electric Industrial Co., Ltd., Osaka, Japan

[21] Appl. No.: 09/173,210

[22] Filed: Oct. 15, 1998

[51] Int. Cl.⁷ .............................. H03H 11/04; H03H 7/12
[52] U.S. Cl. ........................... 333/174; 333/176; 334/15
[58] Field of Search ................................. 333/174, 176; 334/15

[56] References Cited

U.S. PATENT DOCUMENTS

| | | | |
|---|---|---|---|
| 4,646,360 | 2/1987 | Muterspaugh | 333/174 X |
| 5,065,453 | 11/1991 | Thomas | 333/174 X |
| 5,291,159 | 3/1994 | Vale | 333/174 X |
| 5,379,008 | 1/1995 | Bockelman et al. | 333/174 |
| 5,541,558 | 7/1996 | Weber et al. | 333/174 |

*Primary Examiner*—Justin P. Bettendorf
*Attorney, Agent, or Firm*—Ratner & Prestia

[57] ABSTRACT

A filter comprises an inductor, a first variable capacitance diode, a second variable capacitance diode having nearly identical characteristic as the first variable capacitance diode, a control terminal for applying voltage to the first and the second variable capacitance diodes, an input terminal, an output terminal and a signal line between the input terminal and the output terminal. A cutoff frequency is controllable with the voltage applied to the control terminal. The variable frequency filter which can receive a large signal has reduced size due to a structure in which the first and the second variable capacitance diodes having nearly identical characteristics are connected either in series or in parallel with their polarities reversed against each other.

11 Claims, 7 Drawing Sheets

1

CONTROLLABLE FILTER AND HIGH FREQUENCY APPARATUS USING THE SAME

FIELD OF THE INVENTION

The present invention relates to a filter for receiving a large signal and a high frequency apparatus using the same.

BACKGROUND OF THE INVENTION

In the past, a filter of the kind that receives large signals comprises a first fixed filter 1, a second fixed filter 2 and a third fixed filter 3, each having a different operating frequency, connected in parallel between filter change-over switches 4 and 5, as shown in FIG. 18. A common terminal of the filter change-over switch 4 is connected to an input terminal 6, and a common terminal of the filter change-over switch 5 is connected to an output terminal 7, so that their change-over is executed through a change-over unit 9 by a signal from a change-over control terminal 8.

This structure of the prior art, however, has a drawback in that it may become large in size since it may require three fixed filters 1 through 3 as well as many circuitries such as two filter change-over switches 4 and 5, etc. On the other hand, a variable frequency filter consisting of a variable capacitance diode and an inductor may be used alternatively, but it occasionally produces disturbance waves as contrary to its object of being a suppressor of undesirable signals due to harmonics caused by distortion of the variable capacitance diode when a large signal is input.

SUMMARY OF THE INVENTION

A variable frequency filter of the present invention comprises an inductor, a first variable capacitance diode, a second variable capacitance diode having nearly identical characteristics as the first variable capacitance diode, a control terminal for applying voltage to the first and the second variable capacitance diodes, an input terminal, an output terminal, and a signal line between the input terminal and the output terminal, wherein a cutoff frequency is controllable with the voltage applied to the control terminal. A reduction in size of the variable frequency filter, to which the large signal is input, is realized due to a structure in which the first and second variable capacitance diodes having nearly identical characteristics are connected either in series or in parallel with their polarities reversed against each other.

The present invention is a variable frequency filter comprising an inductor and a capacitor, the capacitor being a filter composed of the first and second variable capacitance diodes having nearly identical characteristics connected in series with their polarities reversed against each other. The variable capacitance diodes and the inductor form the variable frequency filter, so that the variable frequency filter which receives the large signal is made small in size and does not produce disturbance waves because the two variable capacitance diodes having nearly identical characteristics are connected with their polarities reversed.

Also the present invention is a variable frequency filter comprising an inductor and a capacitor, the capacitor being a filter composed of the first and second variable capacitance diodes having nearly identical characteristics connected in parallel with their polarities reversed against each other, and the variable capacitance diodes and the inductor composing the variable frequency filter, so that the variable frequency filter for receiving a large signal is made small in size and does not produce disturbance waves because the two variable capacitance diodes having nearly identical characteristics are connected with their polarities reversed. Besides, since two variable capacitance diodes in parallel connection are connected in series with the signal line, a serial resistance of the variable capacitance diodes becomes one half so as to improve passing characteristics.

Also, the present invention is a high frequency apparatus comprising an input terminal, a mixer of which one side of the inputs is supplied with signal input to the input terminal and another side of inputs is connected to an output of a local oscillator, a power amplifier connected to an output of the mixer, a filter connected to an output of the power amplifier, and an output terminal connected to an output of the filter, thereby realizing the high frequency apparatus of a small size having a transmitting function without distortion even if it is input with a large signal amplified by the power amplifier.

Moreover, the present invention is a high frequency apparatus comprising an input terminal for receiving a large signal, a filter connected to the input terminal, a mixer of which one side of the inputs is supplied with an output of the filter and another side of inputs is connected to an output of a local oscillator, and an output terminal supplied with an output of the mixer, thereby realizing a high frequency apparatus of small size having a receiving function without distortion even if it receives a large signal when in close vicinity of a broadcasting station.

DESCRIPTION OF THE PREFERRED EMBODIMENTS

FIRST EXEMPLARY EMBODIMENT

Figure 1:
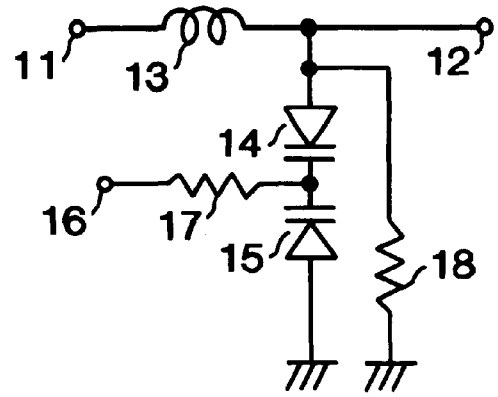
FIG. 1 is a circuit diagram of a filter in accordance with a first exemplary embodiment of the present invention.

A low-pass filter of a first exemplary embodiment of the present invention is described hereinafter by referring to FIG. 1. An inductor 13 is connected between an input terminal 11 and an output terminal 12. Also, two variable capacitance diodes 14 and 15 with their cathode sides connected together as a serially connected composite are connected between a point of connection of the inductor 13 and the output terminal 12 and the earth-ground, with an anode of the variable capacitance diode 15 at the earth-ground side. That is, the variable capacitance diode 14 and the variable capacitance diode 15 are connected in series with their polarities reversed. A control terminal 16 is connected to a connecting point of the cathodes of the variable capacitance diodes 14 and 15 through a resistor 17. A resistor 18 is connected between an anode of the variable capacitance diode 14 and the earth-ground.

In this example, the inductor 13 is a coil of approximately 2 μH, and the variable capacitance diodes 14 and 15 are paired diodes, each having nearly identical characteristics of approximately 1 pF/V. A low-pass filter with its cutoff frequency of approximately 15 to 60 MHz is obtained by applying a voltage of 1 to 25 V to the control terminal 16. The resistors 17 and 18 are for the purpose of supplying voltage to the variable capacitance diodes 14 and 15, for which 27 kΩ resistors are used.

By connecting the variable capacitance diodes 14 and 15 with their polarities reversed as described above, harmonic distortion does not occur. It is presumed by the inventors that the harmonic distortions produced by the variable capacitance diodes 14 and 15 probably cancel each other as they are of opposite phases. In this way, the filter of the present invention can attenuate the harmonic distortion produced at the preceding stage of the filter.

Moreover, there are no known factors for distorting the signal even if a large signal is input, because there is only the inductor 13 existing in the signal line.

The variable capacitance diodes 14 and 15 are paired diodes having nearly identical characteristics as has been described. This signifies that characteristics of the voltage-variable capacitance diode such as a correlation between applied voltage and capacitance at that voltage are substantially identical between them. It is considered, for instance, that two variable capacitance diodes formed at adjacent spots on a single chip are paired diodes having nearly identical characteristics. Or, two variable capacitance diodes selected through measurement of the characteristics can be also paired diodes having nearly identical characteristics.

SECOND EXEMPLARY EMBODIMENT

Figure 2:
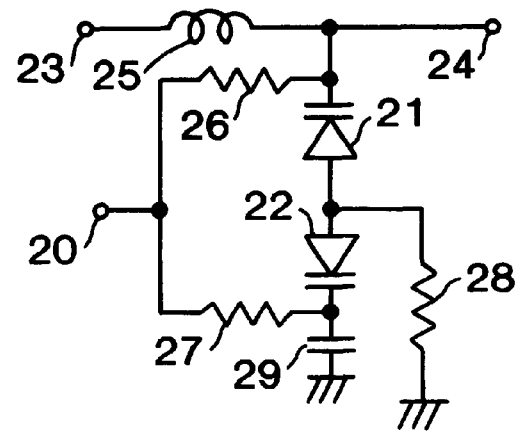
FIG. 2 is a circuit diagram of a filter in accordance with a second exemplary embodiment of the present invention.

A low-pass filter of a second exemplary embodiment of the present invention is described hereinafter by referring to FIG. 2. The low-pass filter of this embodiment is generally the same as that of the first embodiment, except for a point that variable capacitance diodes 21 and 22, which function as capacitors, are connected at their anode sides together to form a serially connected composite. That is, an inductor 25 is connected between an input terminal 23 and an output terminal 24, as in FIG. 2. Also, two variable capacitance diodes 21 and 22 with their anode sides connected together as a serially connected composite are connected between a point of connection of the inductor 25 and the output terminal 24 and the earth-ground. That is, the variable capacitance diode 21 and the variable capacitance diode 22 are connected in series with their polarities reversed. A control terminal 20 is connected to the cathode sides of the variable capacitance diodes 21 and 22 through respective resistors 26 and 27. A resistor 28 is connected between a point of connection of the anode sides of the variable capacitance diodes 21 and 22 and the earth-ground.

In this embodiment, the inductor 25 is a coil of approximately 2 μH, and the variable capacitance diodes 21 and 22 are paired diodes, each having nearly identical characteristics of approximately 1 pF/V. A low-pass filter with its cutoff frequency of approximately 15 to 60 MHz is obtained by applying a voltage of 1 to 25 V to the control terminal 20. The resistors 26, 27 and 28 are for the purpose of supplying voltage to the variable capacitance diodes 21 and 22, for which 27 kΩ resistors are used. A capacitor 29 connected between the cathode of the variable capacitance diode 22 and the earth-ground is for blocking D.C. current, with a capacitance of 2200 pF.

By connecting the variable capacitance diodes 21 and 22 with their polarities reversed as described above, harmonic distortion does not occur. It is presumed by the inventors that, as in the case of the first embodiment, the harmonic distortions produced by the variable capacitance diodes 21 and 22 probably cancel each other as they are of opposite phases. In this way, the filter of this invention can attenuate the harmonic distortion produced at the preceding stage of the filter.

Moreover, there are no known factors for distorting the signal even if a large signal is input, because there is only the inductor 25 existing in the signal line.

There are two cases where two variable capacitance diodes are connected in series with their polarities reversed. One is the case of FIG. 1 wherein two serially connected variable capacitance diodes are joined mutually at their cathodes. And the other is the case of FIG. 2 wherein two serially connected variable capacitance diodes are joined mutually at their anodes.

THIRD EXEMPLARY EMBODIMENT

Figure 3:
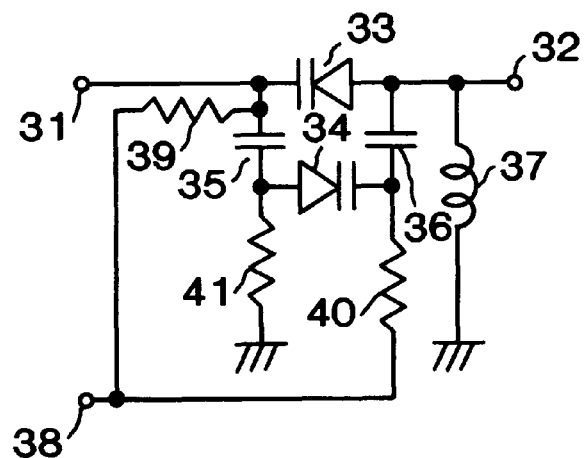
FIG. 3 is a circuit diagram of a filter in accordance with a third exemplary embodiment of the present invention.

A high-pass filter of a third embodiment of the present invention is described hereinfer by referring to FIG. 3. In FIG. 3, two variable capacitance diodes 33 and 34 having nearly identical characteristics are connected in parallel with their polarities reversed between an input terminal 31 and an output terminal 32. That is, from the viewpoint of high frequency, an anode of the variable capacitance diode 33 is connected to a cathode of the variable capacitance diode 34, and a cathode of the variable capacitance diode 33 is connected to an anode of the variable capacitance diode 34. The input terminal 31 is connected to the cathode of the variable capacitance diode 33, and the output terminal 32 is connected to the anode of the variable capacitance diode 33. Capacitors 35 and 36 are for blocking D.C. current, for which 2200 pF capacitors are used. An inductor 37 is connected between a point of connection of the anode side of the variable capacitance diode 33 and the output terminal 32 and the earth-ground. A control terminal 38 is connected to the cathode sides of the variable capacitance diodes 33 and 34 through respective resistors 39 and 40. A resistor 41 is connected between the anode of the variable capacitance diode 34 and the earth-ground. The capacitor 35 is connected between the cathode of the variable capacitance diode 33 and the anode of the variable capacitance diode 34, and the capacitor 36 is connected between the cathode of the variable capacitance diode 34 and the anode of the variable capacitance diode 33.

In this embodiment, the inductor 37 is a coil of approximately 2 µH, and the variable capacitance diodes 33 and 34 are paired diodes, each having nearly identical characteristics of approximately 1 pF/V. A high-pass filter with its cutoff frequency of approximately 15 to 60 MHz is obtained by applying a voltage of 1 to 25 V to the control terminal 38. The resistors 39, 40 and 41 are for the purpose of supplying voltage to the variable capacitance diodes 33 and 34, for which 27 kΩ resistors are used. It is important for this embodiment that capacitances of the capacitors 35 and 36 are equal, and also resistances of the resistors 39 and 40 are of large value as well as equal.

By connecting the variable capacitance diodes 33 and 34 with their polarities reversed as described above, harmonic distortion does not occur. It is presumed by the inventors that the harmonic distortions produced by the variable capacitance diodes 33 and 34 probably cancel each other as they are of opposite phases. In this way, the filter of this invention can attenuate the harmonic distortion produced at the preceding stage of the filter.

Also, because the variable capacitance diodes 33 and 34 in parallel connection are positioned in the signal line, an attenuation characteristic in low frequency band is quite better when compared with the case of the first and second embodiments wherein the inductor is interposed.

FOURTH EXEMPLARY EMBODIMENT

Figure 4:
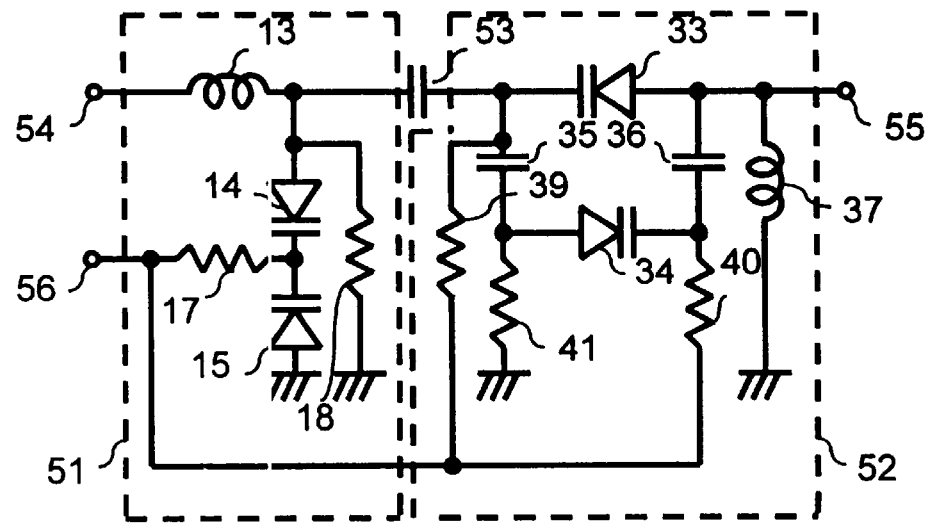
FIG. 4 is a circuit diagram of a filter in accordance with a fourth exemplary embodiment of the present invention.

A band-pass filter or a band-elimination filter of a fourth embodiment of the present invention is described hereinafter by referring to FIG. 4. It is a filter wherein a low-pass filter 51 as recited in the first embodiment and a high-pass filter 52 as recited in the third embodiment are connected in series with a coupling capacitor 53 in-between. The capacitor 53 also functions as a D.C. blocker. An input terminal and an output terminal are designated by reference numerals 54 and 55 respectively. A control terminal is designated by a numeral 56. Constituent components of the low-pass filter 51 and the high-pass filter 52 are designated by the same reference numerals as before, and their descriptions are simplified as they have been described in the first and the third embodiments.

In this fourth embodiment,, a band-pass filter or a band-elimination filter can be composed by properly selecting cut-off frequencies of the low-pass filter 51 and the high-pass filter 52. For instance, a band-pass filter is composed if a cut-off frequency of the low-pass filter 51 is set higher than that of the high-pass filter 52. On the other hand, a band-elimination filter is composed if the cutoff frequency of the low-pass filter 51 is set lower than that of the high-pass filter 52.

FIFTH EXEMPLARY EMBODIMENT

Figure 5:
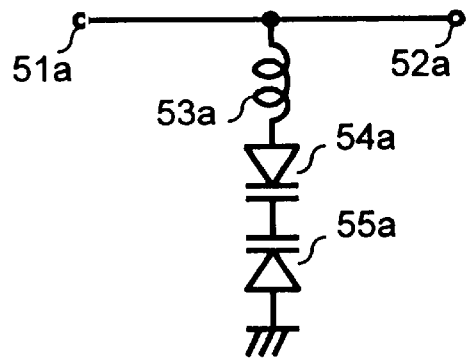
FIG. 5 is a high frequency equivalent circuit diagram of a filter in accordance with a fifth exemplary embodiment of the present invention.

A filter having a steep trapping characteristic in a fifth embodiment of the present invention is described below by referring to FIG. 5. In this embodiment, an inductor 53a is connected in series with a variable capacitance diode 54a and another variable capacitance diode 55a with cathodes of these diodes joined together, between a signal line connecting an input terminal 51a to an output terminal 52a and the earth-ground. In this circuit, a steep trapping characteristic is attained because a series resonance capacity becomes small.

Incidentally, all the circuits referred to in the fifth embodiment and thereafter are depicted in equivalent circuits, two variable capacitance diodes being paired diodes having nearly identical characteristics, and descriptions about the voltage circuit for applying voltage to the variable capacitance diodes being omitted as they are same as the previous embodiments.

SIXTH EXEMPLARY EMBODIMENT

Figure 6:
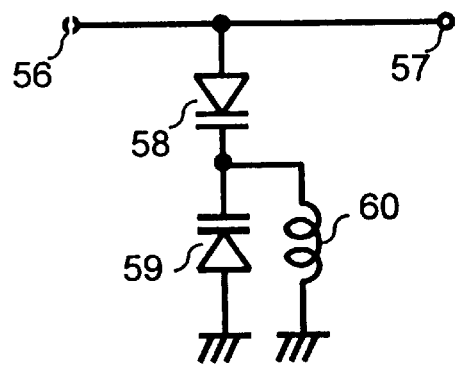
FIG. 6 is a high frequency equivalent circuit diagram of a filter in accordance with a sixth exemplary embodiment of the present invention.

A polarized low-pass filter of variable frequency type of a sixth embodiment of the invention is described hereinafter by referring to FIG. 6. In this embodiment, a variable capacitance diode 58 is connected in series with a parallel connected composite comprising a variable capacitance diode 59 and an inductor 60 between a signal line connecting an input terminal 56 to an output terminal 57 and the earth-ground of the filter. Cathodes of the variable capacitance diodes 58 and 59 are connected with each other. In other words, a serially connected composite comprising the first variable capacitance diode and the second variable capacitance diode is connected between the signal line and the earth-ground, and the inductor is connected between a point of connection of the first and the second variable capacitance diodes at their one ends and the earth-ground.

The inductor 60 needs to be of a considerably high impedance (10 kΩ or higher) in the passing frequency band. Since this embodiment is a polarized low-pass filter of variable frequency type, a circuit of an excellent attenuation characteristic at high frequency band is attainable.

SEVENTH EXEMPLARY EMBODIMENT

Figure 7:
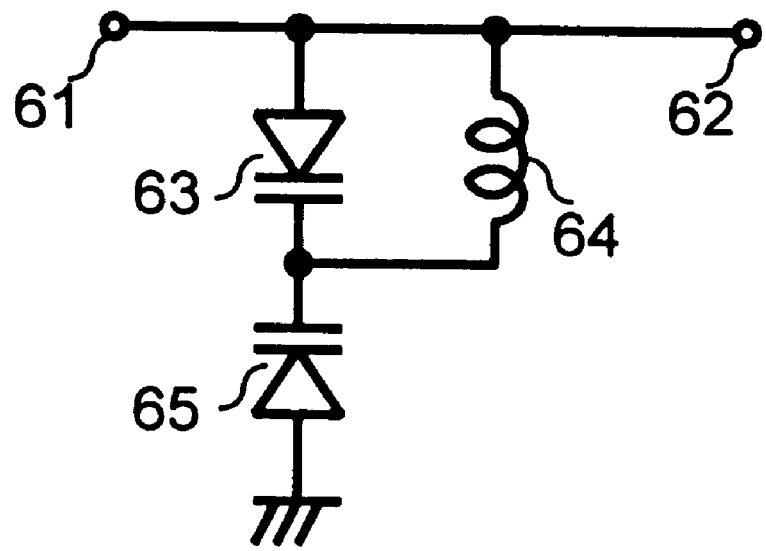
FIG. 7 is a high frequency equivalent circuit diagram of a filter in accordance with a seventh exemplary embodiment of the present invention.

A polarized low-pass filter of variable frequency type of a seventh embodiment of the invention is described hereinafter by referring to FIG. 7. In this embodiment, a parallel connected composite comprising a variable capacitance diode 63 and an inductor 64 is connected in series with a variable capacitance diode 65, between a signal line connecting an input terminal 61 to an output terminal 62 and the earth-ground of the filter. Cathodes of the variable capacitance diodes 63 and 65 are connected with each other. In other words, a serially connected composite comprising the first variable capacitance diode and the second variable capacitance diode is connected between the signal line and the earth-ground, and the inductor is connected between a point of connection of the first and the second variable capacitance diodes and the signal line.

The inductor 64 also needs to be of a considerably high impedance (10 kΩ or higher) in the passing frequency band as in the case of the sixth embodiment. As this embodiment is also a polarized low-pass filter of variable frequency type, a circuit of an excellent attenuation characteristic at high frequency band is attainable.

EIGHTH EXEMPLARY EMBODIMENT

Figure 8:
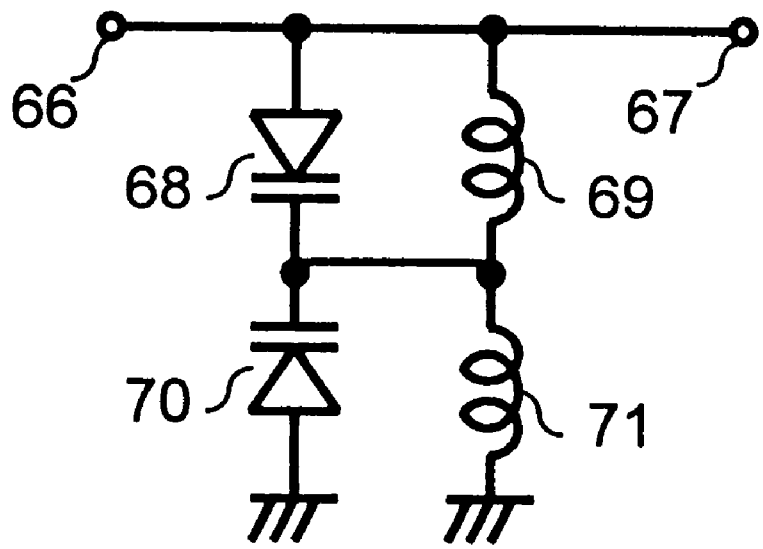
FIG. 8 is a high frequency equivalent circuit diagram of a filter in accordance with an eighth exemplary embodiment of the present invention.

A polarized low-pass filter of variable frequency type of an eighth embodiment of the invention is described hereinafter by referring to FIG. 8. In this embodiment, a parallel connected composite comprising a variable capacitance diode 68 and an inductor 69 is connected in series with another parallel connected composite comprising a variable capacitance diode 70 and an inductor 71, between a signal line connecting an input terminal 66 to an output terminal 67 and the earth-ground of the filter. Cathodes of the variable capacitance diodes 68 and 70 are connected with each other. In other words, a serially connected composite comprising the first variable capacitance diode and the second variable capacitance diode is connected between the signal line and the earth-ground, and each of the inductors are connected between a point of connection of the first and the second variable capacitance diodes and the signal line and between the same point and the earth-ground.

In this case, it is desirable to equalize an inductance of the inductor 69 with an inductance of the inductor 71 in the passing frequency band. Since this embodiment is a polarized low-pass filter of variable frequency type, a circuit of an excellent attenuation characteristic at high frequency band is attainable. It is also useful because frequency for each of the parallel-connected composites is individually fixable for establishing two polarized points.

NINTH EXEMPLARY EMBODIMENT

Figure 9:
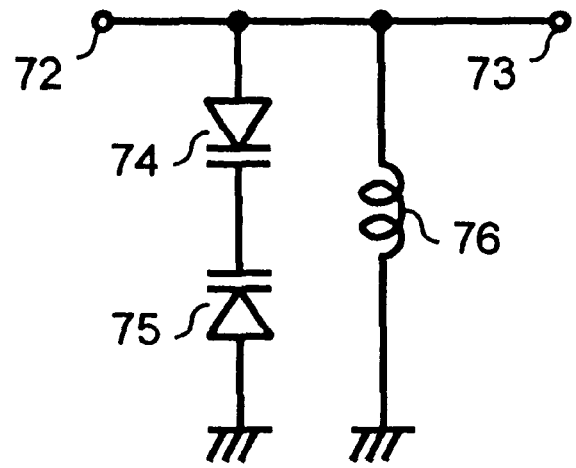
FIG. 9 is a high frequency equivalent circuit diagram of a filter in accordance with a ninth exemplary embodiment of the present invention.

A band-pass filter of a ninth embodiment of the present invention is described hereinafter by referring to FIG. 9. In this embodiment, a serially connected composite comprising a variable capacitance diode 74 and a variable capacitance diode 75 with their cathodes joined together is connected in parallel with an inductor 76, between a signal line connecting an input terminal 72 to an output terminal 73 and the earth-ground of the filter. This circuit allows the band-pass filter to have a simple structure.

TENTH EXEMPLARY EMBODIMENT

Figure 10:
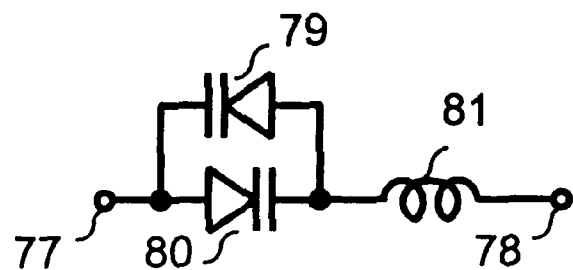
FIG. 10 is a high frequency equivalent circuit diagram of a filter in accordance with a tenth exemplary embodiment of the present invention.

A band-pass filter of a tenth embodiment of the present invention is hereinafter described by referring to FIG. 10. In this embodiment, a parallel-connected composite comprising a variable capacitance diode 79 and a variable capacitance diode 80 with their polarities reversed is connected in series to an inductor 81 between an input terminal 77 and an output terminal 78 of the filter. This results in a band-pass filter also with a simple structure.

ELEVENTH EXEMPLARY EMBODIMENT

A low-pass filter of an eleventh embodiment of the present invention is hereinafter described by referring to FIG. 11. In this embodiment, a variable capacitance diode 84 and a serially connected composite comprising an inductor 85 and a variable capacitance diode 86 are connected in parallel between an input terminal 82 and an output terminal 83 of the filter. A cathode of the variable capacitance diode 84 and an anode of the variable capacitance diode 86 are connected to the output terminal 83. This configuration results in a circuit having good passing characteristics at low frequency.

In this case, a value of the inductor 85 shall be substantially small, preferably 10 Ω or less in the passing frequency band. Or, the inductor 85 may be omitted (the inductance can be 0 Ω).

Figure 11:
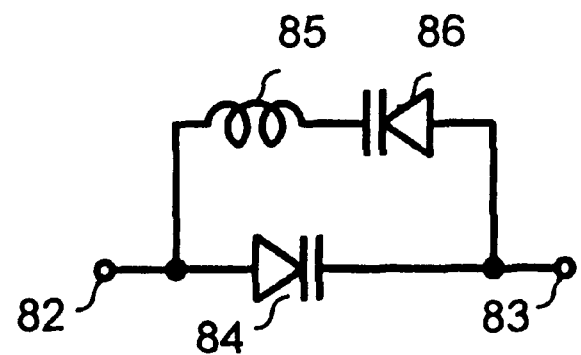
FIG. 11 is a high frequency equivalent circuit diagram of a filter in accordance with an eleventh exemplary embodiment of the presents invention.

Although the inductor 85 is connected between a cathode of the variable capacitance diode 86 and an anode of the variable capacitance diode 84, as shown in FIG. 11, it is still considered as two variable capacitance diodes 84 and 86 being connected in parallel with the polarities reversed to each other, for reasons of expediency in the present invention.

TWELFTH EXEMPLARY EMBODIMENT

Figure 12:
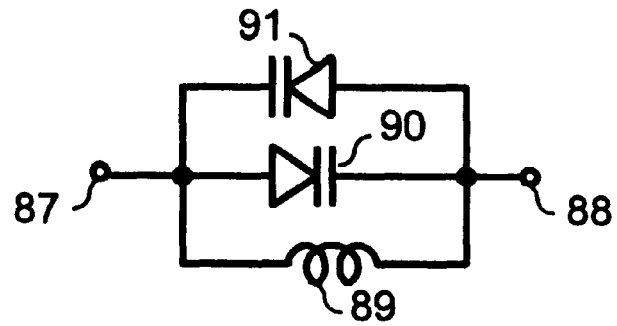
FIG. 12 is a high frequency equivalent circuit diagram of a filter in accordance with a twelfth exemplary embodiment of the present invention.

A filter having a steep trapping characteristic in a twelfth embodiment of the present invention is described below by referring to FIG. 12. In this embodiment, a parallel-connected composite comprising an inductor 89, a variable capacitance diode 90 and a variable capacitance diode 91 is connected between an input terminal 87 and an output teria 88 of the filter. A cathode of the variable capacitance diode 90 and an anode of the variable capacitance diode 91 are connected to the output terminal 88. This circuit attains a steep trapping characteristic because a resistive component of the variable capacitance diodes becomes one half and a parallel resonance capacity is large.

THIRTEENTH EXEMPLARY EMBODIMENT

Figure 13:
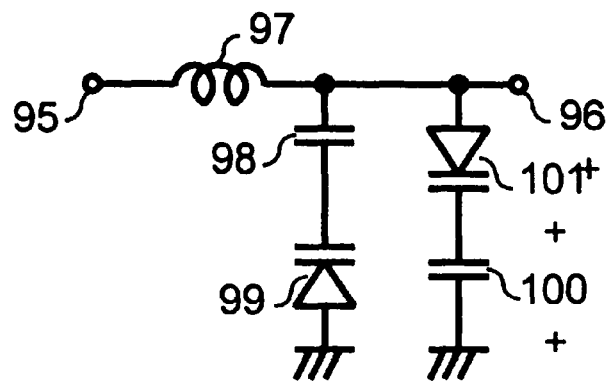
FIG. 13 is a high frequency equivalent circuit diagram of a filter in accordance with a threenth exemplary embodiment of the present invention.

A filter with a small transmission loss in a thirteenth embodiment of the present invention is described below by referring to FIG. 13. This embodiment connects an inductor 97 between an input terminal 95 and an output terminal 96 of the filter. This filter comprises a first serially connected composite, which comprises a capacitor 98 and a variable capacitance diode 99 connected in series with an anode of the diode 99 being at an earth-ground side, and a second serially connected composite, which comprises a capacitor 100 and a variable capacitance diode 101 connected in series with a cathode of the diode 101 being at the earth-ground side, in parallel connection between a point of connection of one of the inductor 97 and the output terminal 96 and the earth-ground. That is, the variable capacitance diodes 99 and 101 are connected in parallel with the polarities reversed. The filter with a small transmission loss is thus attained since the variable capacitance diodes 99 and 101 are connected in parallel, thereby making their resistive component in half.

FOURTEENTH EXEMPLARY EMBODIMENT

Figure 14:
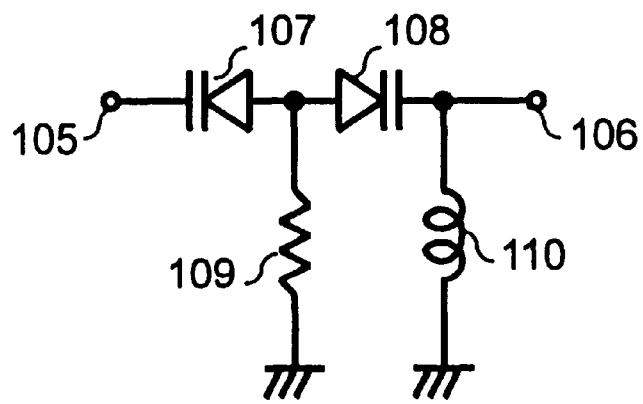
FIG. 14 is a high frequency equivalent circuit diagram of a filter in accordance with a fourteenth exemplary embodiment of the present invention.

A filter having a good passing characteristic in a fourteenth embodiment of the present invention is described below by referring to FIG. 14. This embodiment represents a filter in which a variable capacitance diode 107 and a variable capacitance diode 108 are connected in series between an input terminal 105 and an output terminal 106 of the filter, a resistor 109 is connected between a point of connection of both anodes of the variable capacitance diodes 107 and 108 and the earth-ground, and an inductor 110 is connected between a cathode of the variable capacitance diode 108 and the earth-ground. The filter having a good passing characteristic is attained due to a loose coupling between the input terminal 105 and the output terminal 106 because the variable capacitance diodes 107 and 108 are connected in series between these terminals.

FIFTEENTH EXEMPLARY EMBODIMENT

Figure 15:
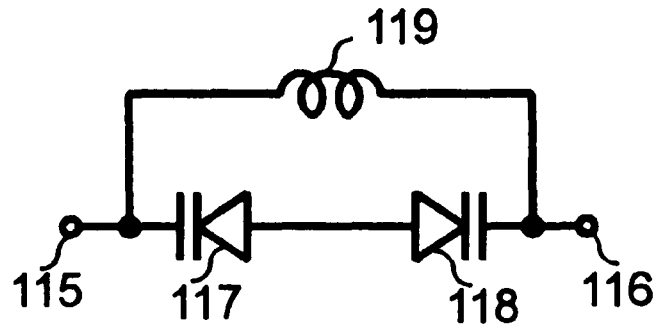
FIG. 15 is a high frequency equivalent circuit diagram of a filter in accordance with a fifteenth exemplary embodiment of the present invention.

A variable-trapping filter of a fifteenth embodiment of the present invention is described below by referring to FIG. 15. In this embodiment, a serially connected composite comprising variable capacitance diodes 117 and 118 is connected between an input terminal 115 and an output terminal 116 of the filter with their cathode sides toward the input terminal 115 and the output terminal 116, and their anodes connected with each other. And an inductor 119 is connected in parallel with this serially connected composite. This filter composes a variable trap that attains a circuit of good attenuation characteristic.

SIXTEENTH EXEMPLARY EMBODIMENT

Figure 16:
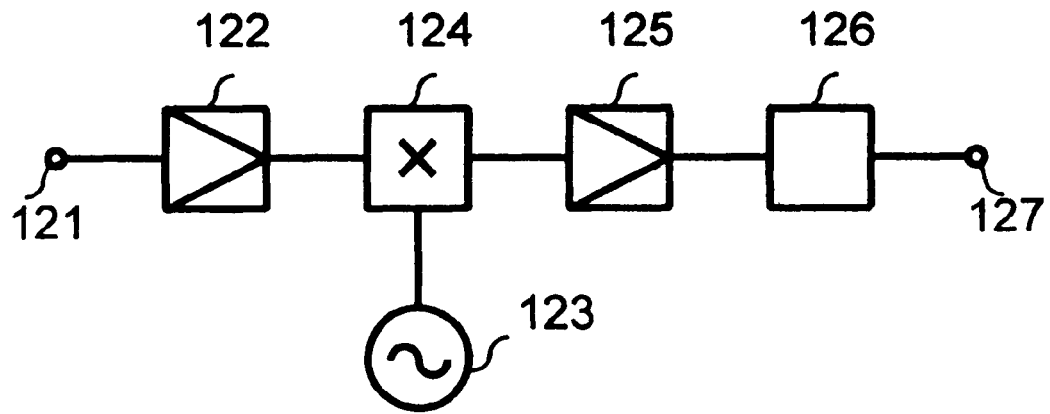
FIG. 16 is a block diagram of a high frequency apparatus in accordance with a sixteenth exemplary embodiment of the present invention using a filter of the present invention.

A high frequency transmission apparatus of a sixteenth embodiment of the present invention is described below by referring to FIG. 16. This embodiment represents a high frequency apparatus for transmitting high frequency waves using a filter of this invention. The high frequency apparatus comprises an input terminal 121, an amplifier 122 connected for signal of the input terminal 121, a mixer 124 of which one side of the inputs is connected with an output of the amplifier 122 and another side of the inputs is connected to an output of a local oscillator 123, a power amplifier 125 connected to an output of the mixer 124, a filter 126 of this invention connected to an output of the power amplifier 125, and an output terminal 127 connected to an output of the filter 126. In this embodiment as an example, the band pass filter described in the fourth exemplary embodiment is applied for the filter 126. This filter 126 realizes the high frequency apparatus, i.e. a transmitter, of a small size without distortion even if it is input with large signal amplified by the power amplifier 125.

SEVENTEENTH EXEMPLARY EMBODIMENT

Figure 17:
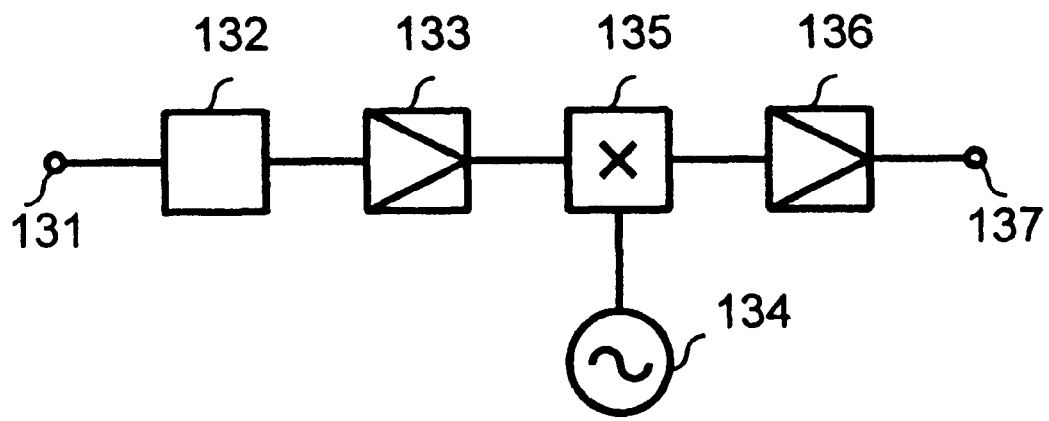
FIG. 17 is a block diagram of a high frequency apparatus in accordance with a seventeenth exemplary embodiment of the presents invention using a filter of the present invention.
Figure 18:
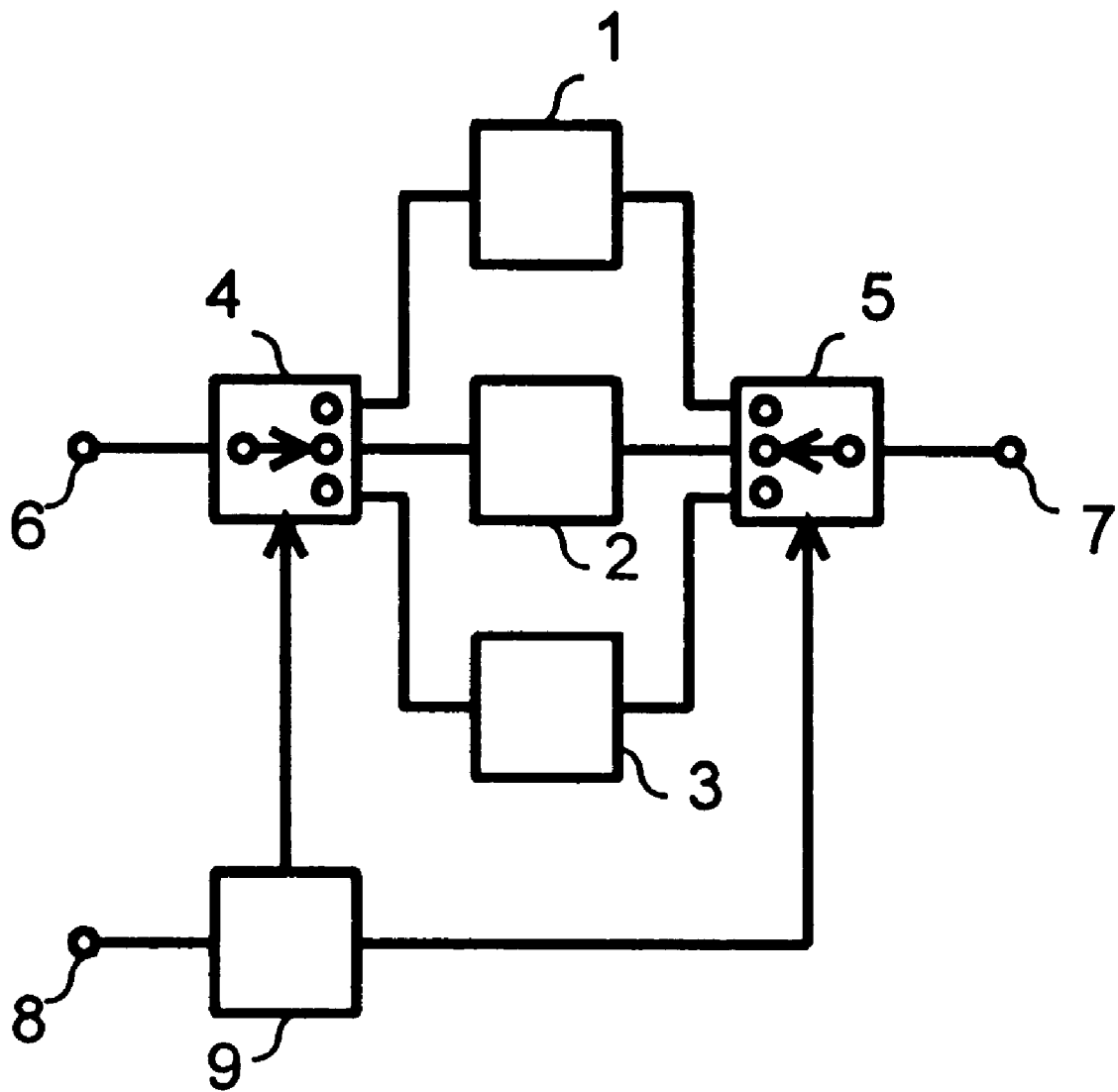
FIG. 18 is a circuit diagram of a filter of the prior art.

A high frequency receiving apparatus of a seventeenth embodiment of the present invention is described below by referring to FIG. 17. This embodiment represents a high frequency apparatus for receiving high frequency waves using a filter of this invention. The high frequency apparatus comprises an input terminal 131 which is input with a large signal as there is in close vicinity of broadcasting station, a filter 132 of this invention connected to the input terminal 131, an amplifier 133 connected to an output of the filter 132, a mixer 135 of which one side of the inputs is connected to an output of the amplifier 133 and another side of inputs is connected to an output of a local oscillator 134, an intermediate frequency amplifier 136 connected to an output of the mixer 135, and an output terminal 137 connected to an output of the intermediate frequency amplifier 136. In this embodiment, the band-pass filter described in the fourth exemplary embodiment is applied for the filter 132 as an example. This filter 132 realizes the high frequency apparatus, i.e. a receiver, of a small size without distortion even if it receives a large signal as is obtained when in close vicinity to a broadcasting station.

As has been described, the present invention realizes a reduction in size of variable frequency filters for receiving a large signal without producing disturbance waves because of the simple structure which includes the inductor and the first and second variable capacitance diodes having nearly identical characteristics which are connected in series or in parallel with their polarities reversed against each other.

What is claimed is:
1. A filter comprising:
an inductor;
a first variable capacitance diode;
a second variable capacitance diode having nearly identical characteristics as said first variable capacitance diode, said second variable capacitance diode is connected in series to said first variable capacitance diode with polarities thereof reversed;
a control terminal for applying voltage to said first variable capacitance diode and said second variable capacitance diode;
an input terminal;
an output terminal; and
a signal line between said input terminal and said output terminal;
said first variable capacitance diode and said second variable capacitance diode are coupled between said signal line and ground, said inductor is coupled between a point of connection of each ends of said first variable capacitance diode and said second variable capacitance diode and said signal line, and a second inductor is coupled between a point of connection of each ends of said first variable capacitance diode and said second variable capacitance diode and ground;
wherein a cutoff frequency of said filter is controllable by changing the voltage applied to said control terminal.

2. A filter comprising:
an inductor;
a first variable capacitance diode;
a second variable capacitance diode having nearly identical characteristics as said first variable capacitance diode;
a control terminal for applying voltage to said first variable capacitance diode and said second variable capacitance diode;
an input terminal;
an output terminal; and
a signal line between said input terminal and said output terminal;
said first variable capacitance diode coupled in parallel with a composite comprising said inductor serially connected to said second variable capacitance diode and said first and second variable capacitance diodes having their polarities reversed;
said first variable capacitance diode and said composite being situated in between said input terminal and said output terminal, and
wherein a cutoff frequency of said filter is controllable by changing the voltage applied to said control terminal.

3. A filter comprising:
an inductor;
a first variable capacitance diode;
a second variable capacitance diode having nearly identical characteristics as said first variable capacitance diode;
a control terminal for applying voltage to said first variable capacitance diode and said second variable capacitance diode;
an input terminal;
an output terminal; and
a signal line between said input terminal and said output terminal;
said inductor and said first variable capacitance diode and said second variable capacitance diode are situated in parallel between said input terminal and said output terminal, said first and second variable capacitance diodes having their polarities reversed, and
wherein a cutoff frequency of said filter is controllable by changing the voltage applied to said control terminal.

4. A filter comprising:
an inductor;
a first variable capacitance diode;
a second variable capacitance diode having nearly identical characteristics as said first variable capacitance diode;
a control terminal for applying voltage to said first variable capacitance diode and said second variable capacitance diode;
an input terminal;

an output terminal; and a signal line between said input terminal and said output terminal;

said inductor is situated between said input terminal and said output terminal, a first composite comprising a first capacitor serially connected to said first variable capacitance diode a second composite comprising a second capacitor serially connected to said second variable capacitance diode;

said first and second composites are situated in parallel between one end of said inductor and the ground and said first and second variable capacitance diodes having their polarities reversed, and wherein a cutoff frequency of said filter is controllable by changing the voltage applied to said control terminal.

5. A filter comprising:

a first filter comprising an inductor, two capacitors of variable capacitance diodes having substantially similar characteristics, said two variable capacitance diodes of said first filter in series with polarities thereof reversed;

a second filter connected in series to said first filter, comprising an inductor, two capacitors of variable capacitance diodes having substantially similar characteristics, said two variable capacitance diodes of said second filter in parallel with polarities thereof reversed;

wherein both of said first filter and said second filter are variable frequency filters;

said inductor of said first filter is in a signal line linking an input terminal with an output terminal, and said first variable capacitance diode, of said first filter, and said second variable capacitance diode, of said first filter, are provided between said signal line of said first filter and ground;

said inductor of said second filter is between said signal line and ground, and said first variable capacitance diode, of said second filter, and said second variable capacitance diode, of said second filter, are provided within said signal line; and a cut-off frequency of said first filter is set to be higher than a cutoff frequency of said second filter.

6. A high frequency apparatus comprising:

an input terminal;

a local oscillator;

a mixer coupled to said input terminal and an output of said local oscillator;

a power amplifier coupled to an output of said mixer; and a filter unit as coupled to an output of said power amplifier said filter comprising: a first filter and a second filter connected in series to said first filter, wherein both of said first filter and said second filter are variable frequency filters each comprising an inductor, two capacitors, of variable capacitance diodes having substantially similar characteristics, said two variable capacitance diodes of said first filter in series with polarities thereof reversed, said two variable capacitance diodes of said second filter in parallel with polarities thereof reversed, said inductor of said first filter is in a signal line linking an input terminal with an output terminal thereof, and said first variable capacitance diode, of said first filter, serially coupled to said second variable capacitance diode, of said first filter, are provided between said signal line of said first filter and ground;

said inductor of said second filter is between said signal line and ground, and said first variable capacitance diode, of said second filter, coupled in parallel with said second variable capacitance diode, of said second filter, are provided within said signal line; and a cut-off frequency of said first filter is set to be higher than a cutoff frequency of said second filter.

7. A high frequency apparatus comprising:

an input terminal for receiving a signal;

filter unit coupled to said input terminal, said filter comprising a first filter and a second filter connected in series to said first filter, wherein both of said first filter and said second filter are variable frequency filters each comprising an inductor, two capacitors, of variable capacitance diodes having substantially similar characteristics, said two variable capacitance diodes of said first filter in series with polarities thereof reversed, said two variable capacitance diodes of said second filter in parallel with polarities thereof reversed, said inductor of said first filter is in a signal line linking am input terminal with an output terminal thereof, and said first variable capacitance diode, of said first filter, serially connected to said second variable capacitance diode, of said first filter, are provided between said signal line of said first filter and ground;

said inductor of said second filter is between said signal line and ground, and said first variable capacitance diode, of said second filter coupled in parallel with said second variable capacitance diode, of said second filter, are provided within said signal line; and a cut-off frequency of said first filter is set to be higher than a cutoff frequency of said second filter, a local oscillator;

a mixer coupled to an output of said filter, and an output of said local oscillator; and an output terminal coupled to an output of said mixer.

8. A high frequency apparatus comprising:

an inductor;

a first variable capacitance diode;

a second variable capacitance diode having nearly identical characteristics as said first variable capacitance diode, said second variable capacitance diode is connected in series to said first variable capacitance diode with polarities thereof reversed;

a control terminal for applying voltage to said first variable capacitance diode and said second variable capacitance diode;

an input terminal;

an output terminal; and a signal line between said input terminal and said output terminal;

said first and second variable capacitance diodes are coupled between said signal line and ground, said inductor is coupled between said signal line and a point of connection of each end of said first variable capacitance diode and said second variable capacitance diode, and a second inductor is coupled between the point of connection of each ends of said first variable capacitance diode and said second variable capacitance diode and ground;

wherein a cutoff frequency of said filter is controllable by changing the voltage applied to said control terminal.

9. A high frequency apparatus comprising:

an inductor;

a first variable capacitance diode;

a second variable capacitance diode having, nearly identical characteristics as said first variable capacitance diode;

a control terminal for applying voltage to said first variable capacitance diode and said second variable capacitance diode;

an input terminal;

an output terminal;

a signal line between said input terminal and said output terminal, said first variable capacitance diode coupled in parallel with a composite comprising said inductor serially connected to said second variable capacitance diode and situated in between said input terminal and said output terminal and said first and second variable capacitance diodes having their polarities reversed; and wherein a cutoff frequency of said filter is controllable by changing the voltage applied to said control terminal.

10. A high frequency apparatus comprising:

an inductor;

a first variable capacitance diode;

a second variable capacitance diode having nearly identical characteristics as said first variable capacitance diode;

a control terminal for applying voltage to said first variable capacitance diode and said second variable capacitance diode;

an input terminal;

an output terminal;

a signal line between said input terminal and said output terminal;

said inductor, said first variable capacitance diode and said second variable capacitance diode are situated in parallel between said input terminal and said output terminal and said first and second variable capacitance diodes having their polarities reversed, and wherein a cutoff frequency of said filter is controllable by changing the voltage applied to said control terminal.

11. A high frequency apparatus comprising:

an inductor;

a first variable capacitance diode;

a second variable capacitance diode having nearly identical characteristic as said first variable capacitance diode;

a first composite comprising said first variable capacitance diode serially coupled to a first capacitor;

a second composite comprising said second variable capacitance diode serially coupled to a second capacitor;

a control terminal for applying voltage to said first variable capacitance diode and said second variable capacitance diode;

an input terminal;

an output terminal;

a signal line between said input terminal and said output terminal;

said inductor is situated between said input terminal and said output terminal, said first and second composites are situated in parallel and coupled between one end of said inductor and ground and said first and second variable capacitance diodes having their polarities reversed; and wherein a cutoff frequency of said filter is controllable by changing the voltage applied to said control terminal.

* * * * *

UNITED STATES PATENT AND TRADE MARK OFFICE
CERTIFICATE OF CORRECTION

PATENT NO. : 6,084,486
DATED : July 4, 2000
INVENTOR(S) : Suzuki et al.

It is certified that error appears in the above-identified patent and that said Letters Patent is hereby corrected as shown below:

Column 12, line 23, delete "am" and insert --an--.

Column 13, line 4, after "having" delete ",".

Signed and Sealed this

Eighth Day of May, 2001

Attest:

NICHOLAS P. GODICI

Attesting Officer        Acting Director of the United States Patent and Trademark Office